DIODE GATE CIRCUIT

Filed Dec. 23, 1952

INPUT SIGNAL VOLTAGE

CONTROL VOLTAGE

OUTPUT VOLTAGE

INVENTOR
R. E. GRAHAM

BY Hugh S. Wertz
ATTORNEY

United States Patent Office 2,723,355
Patented Nov. 8, 1955

2,723,355

DIODE GATE CIRCUIT

Robert E. Graham, Chatham Township, Morris County, N. J., assignor to Bell Telephone Laboratories, Incorporated, New York, N. Y., a corporation of New York Application December 23, 1952, Serial No. 327,612

4 Claims. (Cl. 307—88.5)

This invention relates to electronic switching circuits and more particularly to gating circuits or "gates" employing asymmetrically conducting devices which transfer electrical energy therethrough under the control of applied voltages.

A gating circuit is characterized as a circuit adapted to be positioned between a source of input waves and a wave utilization device, and which permits the transmission of a portion of a waveform applied thereto that occurs within a given time interval determined by an external control voltage pulse. Inasmuch as the circuit transmits signals only during the given time intervals, it is said to constitute a switch, or a "gate" which is "on" during the given intervals and "off" at all other times.

While there are a number of gating circuits known in the art, one type of four terminal gate found in wide use utilizes a T-network of asymmetrically conducting devices having like electrodes connected at the junction point of the devices. The series arms of the network are connected between one of the gate input terminals and one of the gate output terminals and the shunt arm is connected through a control voltage source to a common connection between the other of the input terminals and the other of the output terminals. A load resistor, across which the output wave is measured, is connected between the output terminals. In this gating circuit, the control voltage is selected with respect to the signal voltage so that the gate displays a low impedance in the series arms when the control voltage is such as to cause voltages of one polarity on the devices in the series arms, and a high impedance when the control voltage is such as to cause voltages of the opposite polarity on the devices in the series arms. In the low impedance condition, input signals are transmitted through the circuit and the gate is said to be "on." In the high impedance condition, transmission is substantially blocked and the gate is said to be "off."

Though this circuit has many advantages over other gating circuits in the art, such as simplicity, compactness and low cost, it does have the disadvantage that the plurality of asymmetrically conducting devices required in the series transmission path causes undesired attenuation in the transmitted signal when the gate is "on." In addition, when the input source and the output load impedances are made equal, a two-to-one voltage loss is observed in the transmitted signal. If instead the load impedance is made high with respect to the input source impedance to cut down the power loss, an alternate disadvantage arises from the effect of parasitic capacitance shunting the output terminals, thereby causing the gate to have poor high frequency response characteristics.

It is an object of this invention to provide an electronic gating circuit that overcomes the above-described disadvantages while retaining the advantages of simplicity, compactness, and low cost.

In an exemplary embodiment of the invention, there is provided a four-terminal electronic gating circuit adapted to be positioned between a source of positive voltage input signals and a useful output load. The gating circuit includes an L-network of asymmetrically conducting devices having like electrodes connected at the junction of the devices. One arm of the L-network is connected in a series path between one of the gate input terminals and one of the gate output terminals, the other of the arms is connected in a shunt path through a resistor and a parallel-connected control circuit to a common connection between the other of the input terminals and the other of the output terminals, and a source of direct current is connected across the output terminals of the gating circuit. The control circuit includes a further asymmetrically conducting device having a like electrode connected to that of the shunt device in the L-network and a series connected control voltage source.

The control voltage is selected with reference to the voltages of the input signal source and the direct current source so that during a given time interval the L-network shunt device is biased in a high impedance condition and the series device is biased in a low impedance condition so that substantially all of the current flow in the circuit is in the series path, thereby establishing the gate in its "on" position. During another time interval, the control voltage is selected so as to cause the L-network shunt device to be biased in its low impedance condition and the series device in its high impedance condition thereby establishing the gate in its "off" position.

One important advantage of this arrangement is that the series path includes but a single impedance element that can be made to display such a low impedance in the gate "on" position that the input signals are transmitted therethrough substantially unaffected while yet displaying a sufficiently high impedance in the gate "off" position so as to substantially block the transmission of power therethrough.

Another advantage of this gating circuit is that the connection between the series transmission path and the control voltage source is through a pair of series opposed asymmetrically conducting devices which provides a high blocking impedance between the source and the transmission path at all times, thereby preventing the control voltage from appearing in the output voltage waveform.

A further advantage is that the parasitic capacitance associated with the output terminal connections of the circuit is rapidly charged from the direct current source when the gate is turned "on" and rapidly discharged through the low impedance shunt path when the gate is turned "off" thereby assuring good high frequency response characteristics in the circuit.

In another embodiment of the invention, adapted to be connected to a source of positive and negative voltage input signals, a constant potential source is connected in series with the shunt resistor in the control circuit of the above-described embodiment.

The invention, and its advantages will be more readily understood by referring to the following description taken in connection with the accompanying drawings forming a part thereof in which.

Figure 1:
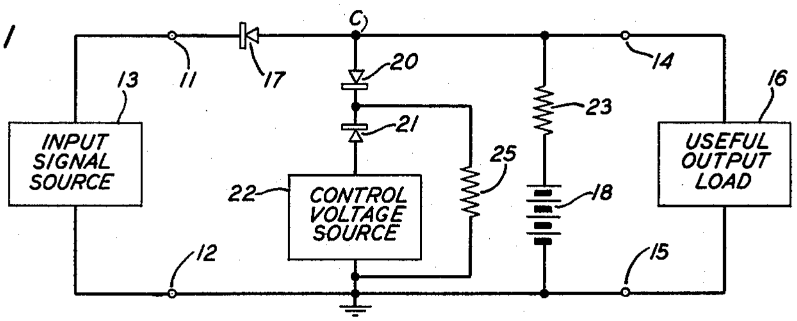
Figs. 1 and 2 are schematic circuit diagrams of two electronic gating circuits embodying the principles of the present invention.

Referring now to Fig. 1, there is shown therein one embodiment of the invention which is adapted to transfer positive voltage input signals to a useful output load. This electronic gating circuit includes input terminals 11 and 12 which are connected to an input signal source 13, and output terminals 14 and 15 which are connected to a useful output load 16. Input terminal 12 is connected directly to terminal 15 and to ground potential, and terminal 11 is connected to terminal 14 through an asymmetrically conducting device 17 which is oriented so that it presents a low impedance to current flowing in a direction from the terminal 14 to the terminal 11. Examples of suitable asymmetrically conducting devices are vacuum tube diodes and germanium crystal rectifiers. Direct current is supplied to the circuit from a constant potential source 18 and a load resistor 23 connected across the terminals 14 and 15. Source 18 and resistor 23 are chosen so that they provide sufficient biasing current in the circuit and so that for normal operation of the gate, the potential of source 18 is large as compared to the signal voltage from source 13. A shunt path across the terminals 14 and 15 is provided by an asymmetrically conducting device 20 having a like electrode connected to that of the device 17 at a junction point *c*, a control circuit which includes asymmetrically conducting device 21 and a control voltage source 22, and a shunt resistor 25 connected in parallel across the control circuit. The devices 20 and 21 have like electrodes connected at their juncture in the shunt path.

With reference to the mode of operation of the gating circuit shown in Fig. 1, it is understood that the direction of the arrowhead in the symbols which represent the devices 17, 20 and 21 indicates the low impedance direction of positive current flow. That is, a positive current flowing through such a device in the direction of the arrowhead experiences a relatively low impedance, and the current flow will be little affected by the device. Such a current is said to be a forward current and the device in which a forward current flows is said to be biased in its low impedance or passing direction. Current flow in the opposite direction experiences a relatively high impedance so that there will be little current flow in that direction. Such a current is said to be backward current and the device is said to be biased in its high impedance or blocking direction. Assuming the asymmetric devices to have characteristics such that they realize a sharp transition from low to high impedance, the transition will occur when both electrodes of a device are substantially at the same potential. Necessarily, then to cause current to flow in either direction through such a device a potential difference must be established between the electrodes of the device.

Figure 3A:
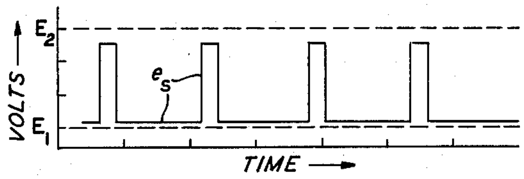
Figs. 3A and 3B illustrate voltages adapted to be supplied to the electronic gating circuit of Fig. 1.
Figure 3B:
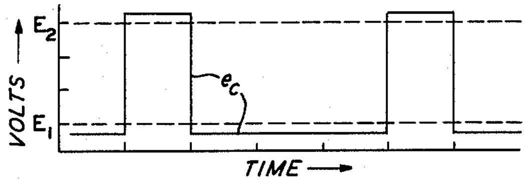

In the circuit of Fig. 1, device 17 will be biased in a high impedance direction and will cause large attenuation in the power flowing therethrough if the input signal voltage $e_s$ from source 13, shown in Fig. 3A, is greater than a voltage $E_1$ and the control voltage $e_c$ from source 22, shown in Fig. 3B, is less than $E_1$, wherein $E_1$ is the voltage that will be established at point *c* when current flows from source 18 through resistor 23, device 20 and resistor 25 to ground. This will be evident from a consideration of the current flow through the various elements of the circuit and the resulting effective impedances of the various asymmetric devices.

Under the above-described conditions, current flows in the circuit from source 18 through resistor 23, device 20 and device 21 to source 22 and also through device 20 and resistor 25 to ground. The current flow through device 21 is in a backward direction and the device is biased in its high impedance direction thereby blocking any appreciable conduction through device 21. The current flow through device 20 is in a forward direction and the device is biased in its low impedance direction so that substantially all of the current flow from source 18 is through resistor 23, device 20 and resistor 25 and point *c* is established at $E_1$ volts. Inasmuch as the signal voltage applied at terminal 11 from source 13 is greater than $E_1$, the current flow through device 17 is in a backward direction and the device is biased in its high impedance direction. Consequently, the gate causes large attenuation in signal power flowing from source 13 to the output load through device 17, and the gate is in its "off" position.

Figure 3C:
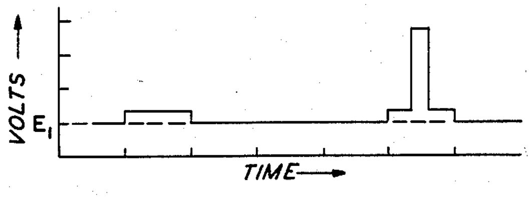
Fig. 3C illustrates the output voltage from the gating circuit of Fig. 1.

Viewed differently, the gate circuit in this condition is an L-network having a low shunt arm impedance through device 20 and resistance 25, and a high series arm impedance through device 17 so that substantially all of the current flow is through the shunt arm and substantially no current flow is through the series arm. The input voltage is thereby blocked from the output load and the gate is established in its "off" position, with the voltage across the output terminals equal to $E_1$ as shown in Figure 3C.

However, if the control voltage $e_c$ applied to the gate is greater than a voltage $E_2$ (which voltage $E_2$ is greater than $E_1$) and the potential of source 18 is suitably greater than $E_2$, then for input signal voltages that are less than $E_2$ there will always be a small attenuation in the signal power flowing through device 17. Under the above circumstance current flows from source 22 through device 21 and device 20 to point *c* and also through device 21 and resistor 25 to ground. The current flow through device 20 is in a backward direction and the device is biased in its high impedance direction, thereby blocking any appreciable conduction therethrough. Device 21 is biased in its low impedance direction and substantially all of the current flow is through device 21 and resistor 25 to ground. With a signal voltage from source 13 less than $E_2$, current flows through device 17 in the forward direction and device 17 is biased in its low impedance direction. Hence, the attenuation in power flowing through device 17 is slight and the gate is established in its "on" position.

In terms of an L-network, the circuit in this condition comprises a low series impedance arm through device 17 and a high shunt arm impedance arm through device 20 and resistor 25. Substantially all of the current flow from source 18 is through the series arm and the gate is established in its "on" position. The input signal waveform is reproduced across the output terminals and the output voltage shown in Fig. 3C appears as the instantaneous value of the input signal voltage $e_s$ measured from a voltage platform or pulse, which voltage pulse is substantially equivalent to the small forward voltage drop across the series arm impedance device 17.

From the above discussion, it will be seen that the input signal voltage $e_s$ must be greater than $E_1$ and less than $E_2$ as shown in Fig. 3A. Additionally the proper control voltage $e_c$ required to switch the gate from the "off" to the "on" position is a positive rectangular pulse rising from a voltage base that is less than $E_1$ to a voltage that is greater than $E_2$ as shown in Fig. 3B. From Fig. 3C, it can be seen that because there is but a single impedance element in the series path between terminal 11 and terminal 14, the voltage platform appearing in the output when the gate is "on" is small and the input signal waveform is faithfully reproduced on the voltage platform. Inasmuch as device 20 is biased in its high impedance direction when the gate is "on" and device 21 is biased in its high impedance direction when the gate is "off," the control voltage and any fluctuations thereof are prevented from appearing in the output signal waveform.

Figure 2:
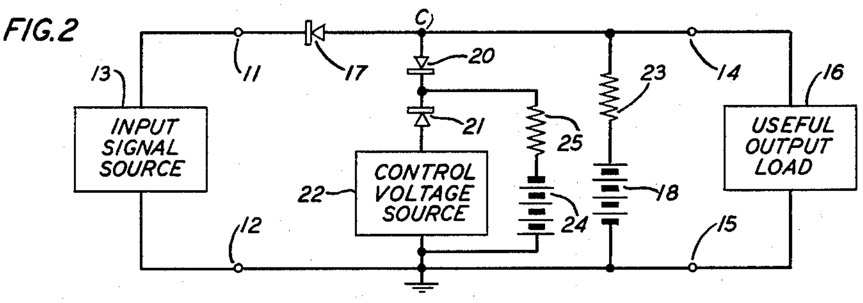

Fig. 2 shows a modification of the invention which is adapted to transfer both positive and negative voltage input signals. This electronic gate is similar to that of Fig. 1 and where the elements of the two circuits are similar they have been given the same reference characters. The circuit of Fig. 2 includes as an additional circuit element a constant potential source 24 connected in series with resistor 25 and to ground potential. The negative pole of source 24 is connected to resistor 25 and the positive pole to ground to establish a negative bias in the shunt path. In this circuit, the parameter voltage $E_2$ will remain unchanged but the parameter voltage $E_1$ will be a new voltage established at point *c* when the current flows through the path including source 18, resistor 23, device 20, resistor 25 and source 24. It is obvious that the mode of operation of the circuit shown in Fig. 2 is otherwise similar to that shown in Fig. 1 as described above.

While there are a number of possible values suitable for use in the circuit elements, circuit constants used in an operable embodiment of the electronic gating circuit of Fig. 1 (for a gate in which the input signal voltage varied between 1.8 and 2.3 volts and the rectangular control voltage wave rose from a base of −8.5 volts to a peak of +8.5 volts) and which are reproduced here merely by way of example are:

17—CK707 (Raytheon) germanium diode
18—300 volts
20—CK707 (Raytheon) germanium diode
21—CK707 (Raytheon) germanium diode
23—0.33 megohms
25—1500 ohms It is understood that the above-described arrangements are merely illustrative of the application of the principles of the invention. Numerous other arrangements might be devised by those skilled in the art without departing from the spirit and scope of the invention.

What is claimed is:

1. An electronic gating circuit comprising a pair of input terminals and a pair of output terminals, said input terminals being adapted to be connected to an input signal source, an L-network of symmetrically conducttion devices having like electrodes connected at the junction point thereof, means for connecting one arm of said network in a series path between one of said input terminals and one of said output terminals, a resistor connected in series to the other arm of said network, means for connecting said resistor to the other of said input terminals and the other of said output terminals to form a shunt path through said other arm of the network and said resistor, a source of direct current for said gating circuit, means for connecting said source in parallel with said shunt path, and a control voltage source and further asymmetrically conducting device joined in a series relationship and connected in parallel with said resistor to control the potential at the junction of said resistor and other arm of said network whereby the impedances of said network devices are controlled.

2. An electronic gating circuit according to claim 1 in further combination with a constant potential source connected in series with said resistor in said shunt path.

3. An electronic gating circuit comprising a pair of input terminals and a pair of output terminals, means for connecting said input terminals to an input signal source, an L-network of asymmetrically conducting devices having like electrodes connected at the junction point, each of said devices having a low impedance direction and a high impedance direction therethrough, means for connecting one of said input terminals to one arm of said network and one of said output terminals to the junction point whereby the series path from said output terminal to said input terminal is in the low impedane direction, a resistor connected in series to the other arm of said network, means for connecting said resistor to the other of said input and said output terminals to form a shunt path between the output terminals of the circuit, a source of direct current for said circuit, means for connecting said source across the output terminals, and means for controlling the direction of current flow in the devices of the L-network said means including a further asymmetrically conducting device and a series connected control voltage source connected in parallel across said resistor.

4. An electronic gating circuit comprising a pair of input terminals and a pair of output terminals, means for connecting said input terminals to an input signal source, an L-network of asymmetrically conducting devices having like electrodes connected at the junction point, each of said devices having a low impedance direction and a high impedance direction therethrough, means for connecting one of said input terminals to one arm of said network and one of said output terminals to the junction point whereby the series path from said output terminal to said input terminal is in the low impedance direction, a first constant potential source having a positive and a negative pole and a resistor connected in series to said negative pole, means for connecting said resistor to said other arm of the L-network and the positive pole of said first source to the other of said input and said output terminals to form a shunt path between the output terminals of the circuit, a source of direct current including a second constant potential source havinga positive and a negative pole, and a load resistor connected in series to said positive pole, means for connecting said load resistor to the output terminal at said junction point and the negative pole of said second source to the other of the output terminals, and means for controlling the direction of current flow in the devices of the L-network, said means including a further asymmetrically conducting device and a series connected control voltage source connected between said shunt path conducting device and the other of said input terminals and output terminals, said further conducting device and said shunt path conducting device having like electrodes connected.

References Cited in the file of this patent

UNITED STATES PATENTS 2,466,959 Moore ______________ Apr. 12, 1949
2,535,303 Lewis _______________ Dec. 26, 1950